United States Patent
Yu et al.

(10) Patent No.: US 6,518,775 B1
(45) Date of Patent: Feb. 11, 2003

(54) PROCESS FOR DETERMINING SPACING BETWEEN HEATER AND SHOWERHEAD

(75) Inventors: Hung-Hsiu Yu, Tao-Yuan (TW); Alex Wu, Hsin-Chu (TW); Ming Chih Sung, Chang-Hua (TW)

(73) Assignee: ProMos Technologies Inc., Hsinchu (TW)

( * ) Notice: Subject to any disclaimer, the term of this patent is extended or adjusted under 35 U.S.C. 154(b) by 114 days.

(21) Appl. No.: 09/712,254

(22) Filed: Nov. 15, 2000

(51) Int. Cl.⁷ .............................................. C23C 16/00
(52) U.S. Cl. .................................... 324/661; 427/248.1
(58) Field of Search ................................ 324/661, 658, 324/662, 699; 427/248.1

(56) References Cited

U.S. PATENT DOCUMENTS 2,745,993 A * 5/1956 Foster ........................ 264/293
5,382,911 A * 1/1995 Cotler et al. ................ 324/661
6,147,855 A * 11/2000 Taylor, Jr. ................... 361/277
6,210,754 B1 * 4/2001 Lu et al. ................... 427/248.1

* cited by examiner

Primary Examiner—Christine K. Oda
Assistant Examiner—Vincent Q. Nguyen
(74) Attorney, Agent, or Firm—Birch, Stewart, Kolasch & Birch, LLP

(57) ABSTRACT

The present invention provides a process for determining the spacing between a heater and a showerhead. First, at least one variable capacitor is placed between the heater and the showerhead, such that the spacing between the heater and the showerhead is in a predetermined relationship to the capacitance of the variable capacitor. Then, the capacitance of the variable capacitor is measured, and the spacing between the heater and the showerhead is converted from the capacitance. The determination process of the present invention can be conducted at high temperature above 350° C., and the spacing can be determined without opening the deposition chamber. This makes the entire process very convenient and the cost can be saved.

9 Claims, 3 Drawing Sheets

PROCESS FOR DETERMINING SPACING BETWEEN HEATER AND SHOWERHEAD

BACKGROUND OF THE INVENTION

1. Field of the Invention:

The present invention relates to a process for determining the spacing between a heater and a showerhead, and more particularly to a process for determining the spacing between a heater and a showerhead at a temperature higher than 350° C.

2. Description of the Prior Art:

In a chemical vapor deposition reaction chamber, the showerhead plays the role of distributing gas. After a period of deposition, undesired materials will attach on the showerhead surface. Consequently, during the subsequent deposition, the thin film deposition properties including the deposition rate, stress and etch rate are adversely affected. This makes it difficult to maintain the process performance stable. Therefore, it is necessary to clean the showerhead or even change a new showerhead.

The spacing between the heater and showerhead has influence on the deposition uniformity. Therefore, when the showerhead is cleaned or changed and installed back above the heater in the chemical vapor deposition reaction chamber, the spacing between the showerhead and the heater should be accurately determined and controlled to meet the standard spacing value.

Nowadays, the device or sensor for determining the spacing between the heater and showerhead can not withstand high temperatures above 350° C., and deteriorates at such high temperatures. Therefore, the process for determining the spacing between the heater and showerhead is usually conducted at low temperatures. However, when the chemical vapor deposition (CVD) process proceeds, the heater is increased to a high temperature above 350° C. Thus, the actual spacing at high temperatures during the CVD process is different from the spacing determined at low temperatures. That is, when the spacing determined at low temperatures meets the standard value, the actural spacing at high temperatures during the CVD process does not meet the standard value.

Therefore, a process for determining the spacing between the heater and showerhead at high temperatures by means of sandwiching a lump of aluminum foil between the heater and the showerhead has been developed recently. Taking Novellus SEQUEL chemical vapor deposition machine as an example, the process chamber is first evacuated; after the heater is increased to 400° C., the chamber is opened and three previously kneaded lumps of aluminum foil are placed on the locations where the respective showerheads are to be placed on the heater. Then, the showerheads are lowered to a predetermined position. The chamber is evacuated, and heated to 400° C. again. Then, the chamber is opened, the lumps of aluminum foil which have been pressed flat by the showerheads are taken out and determined their thickness with vernier calipers. The thickness is the spacing between the heater and showerhead. If the spacing determined does not meet the standard value, then adjust the spacing and repeat the above-mentioned determination steps until the spacing meets the standard value.

However, in the determination process, the lumps of aluminum foil should be taken out and determined with great care lest the accuracy is influenced. In addition, in order to make the spacing meet the standard value, many times of determination should be conducted, aluminum foil lumps should be taken out for determination for many times, the reaction chamber should be opened and closed for many times, and the chamber should be evacuated for many times. This makes the entire process very lengthy and the cost is inevitably increased.

SUMMARY OF THE INVENTION

Therefore, the object of the present invention is to solve the above-mentioned problems and to provide a process for determining the spacing between a heater and a showerhead. The determination process of the present invention can be conducted at high temperatures above 350° C. In addition, the spacing value can be determined without opening the deposition reaction chamber, which is very convenient and with high accuracy, and the cost can be decreased.

To achieve the above objects, the process for determining the spacing between a heater and a showerhead according to the present invention includes the steps of:

(a) placing at least one variable capacitor between the heater and the showerhead, such that the spacing between the heater and the showerhead is in a predetermined relationship to the capacitance of the variable capacitor;

(b) measuring the capacitance of the variable capacitor; and (c) converting the capacitance into the spacing between the heater and the showerhead.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE PREFERRED EMBODIMENTS

Figure 3:
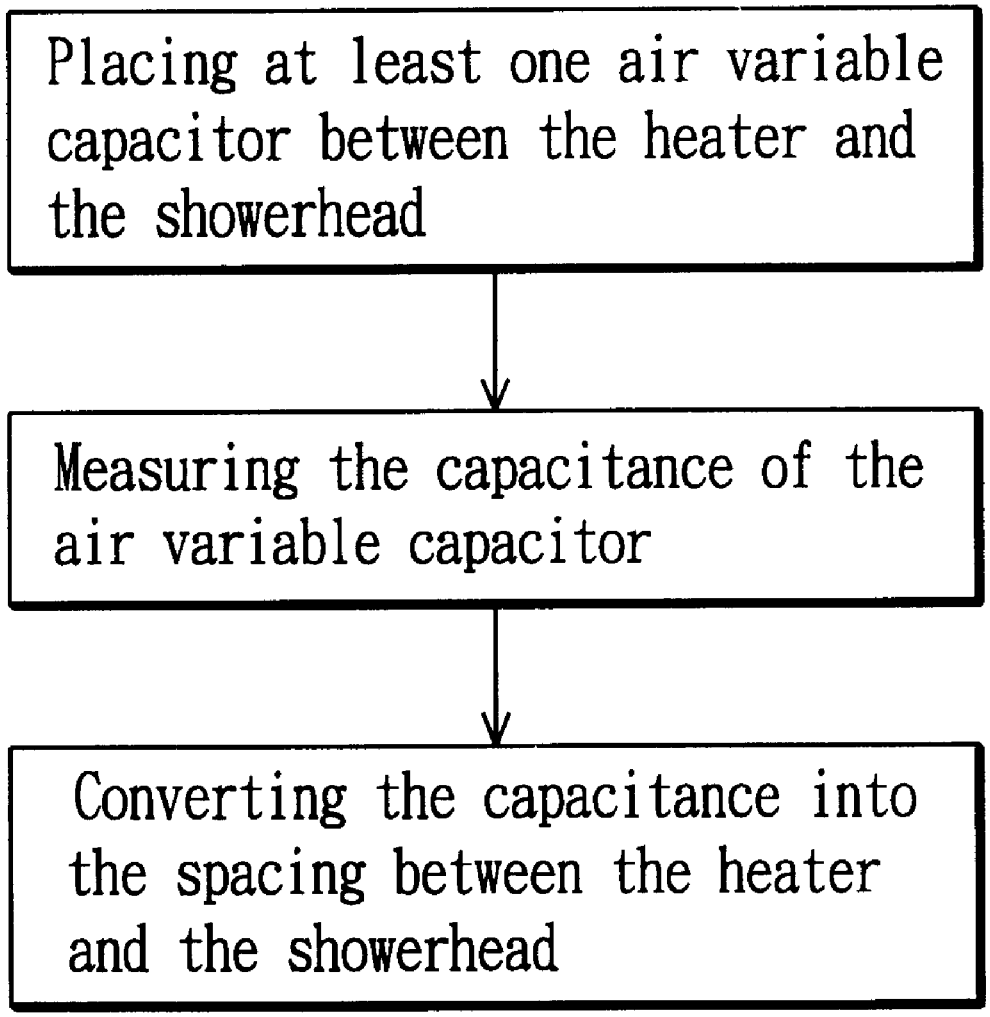
FIG. 3 shows the process flow of the present invention.

In general, there is one or a plurality of, for example, six, showerheads placed above the heater in the chemical vapor deposition reaction chamber. Thus, six pieces of wafers can be deposited simultaneously in the same chamber. According to the present invention, the process for determining the spacing between a heater and a showerhead includes the steps as shown in FIG. 3: placing at least one variable capacitor between the heater and the showerhead, measuring the capacitance of the air variable capacitor; and converting the capacitance into the spacing between the heater and the showerhead. The spacing between the heater and the showerhead must be in a predetermined relationship to the capacitance of the variable capacitor.

The relationship between the spacing and the capacitance can be that when the spacing decreases, the variable capacitor has a higher capacitance, and when the spacing increases, the variable capacitor has a smaller capacitance.

Figure 2A:
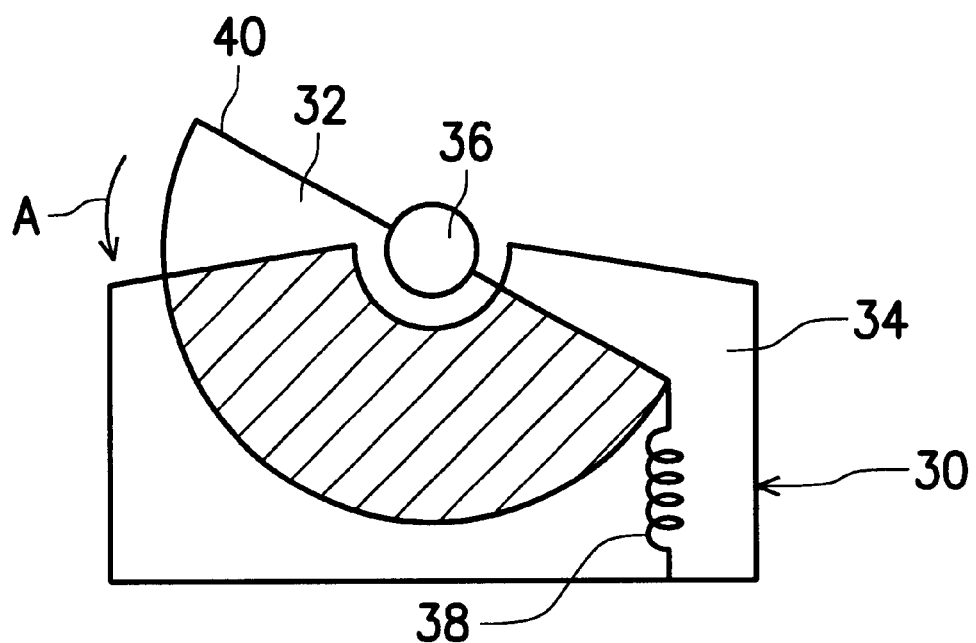
FIG. 2A is a schematic front view of an air variable capacitor.
Figure 2B:
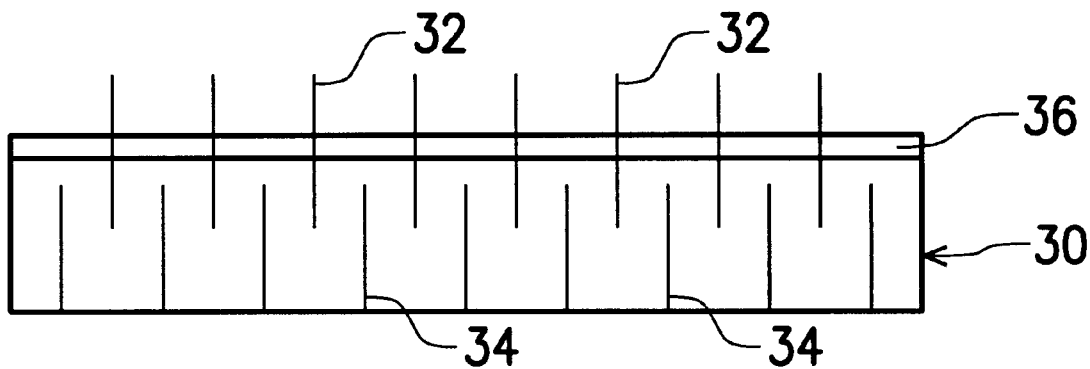
FIG. 2B is a schematic side view of an air variable capacitor.

For example, the present invention can use an air variable capacitor. One example of the air variable capacitor is shown in FIG. 2A and FIG. 2B. The air variable capacitor 30 is provided with two sets of conductive plates, the upper set of conductive plates 32 and the lower set of conductive plates 34. Each set of conductive plates includes a plurality of parallel and integrally formed conductive plates, and the two sets of conductive plates 32 and 34 are alternatively disposed and are overlapping. The overlapping portion is shown by oblique lines in FIG. 2A. Since the conductive plates are in an overlapping state, capacitance is thus generated.

By the formula $C=\epsilon(A/d)$ (A is the overlapping area, and d is the distance between the plates), when the overlapping area increases, the air variable capacitor will generate a larger capacitance; and when the overlapping area decreases, the air variable capacitance will have a smaller capacitance. Thus, the capacitance of the air variable capacitor can be changed by means of changing the overlapping area of the conductive plates.

According to a first preferred embodiment of the present invention, an air variable capacitor is used to determine the spacing between a heater and a showerhead. The operation is explained below. First, an air variable capacitor 30 is placed on a heater, and then a showerhead is placed above the air variable capacitor 30. At that time, the surface 40 of the upper set of conductive plates 32 of the air variable capacitor 30 is pressed downwardly, and the upper set of conductive plates 32 is rotated via the shaft 36 along the direction of arrow A. This will make the overlapping area of the conductive plate sets 32 and 34 increase, thus increasing the capacitance between the plates. Then, the capacitance of the air variable capacitor is measured, and the spacing between the heater and showerhead can be converted from the capacitance.

Preferably, the air variable capacitor 30 can further include a restoration device 38 (see FIG. 2A), which is provided at one end of the upper set of conductive plates 32 to connect to the lower set of conductive plates 34. As mentioned above, when the showerhead is placed above the air variable capacitor 30 to make the capacitor pressed downwardly, the overlapping area of the conductive plate sets 32 and 34 increases, thus increasing the capacitance between the plates. When the showerhead is removed, the upper set of conductive plates 32 is thus released from the force. At that time, the upper set of conductive plates 32 can be restored by the restoring operation of the restoration device 38 to its original state. Then, the showerhead can be placed above the capacitor again to start another determination process. Therefore, by using an air variable capacitor with a restoration device, the determination process can be conducted continuously for many times.

When an air variable capacitor with a restoration device is used, the signal of the air variable capacitor should be introduced to the outside of the reaction chamber. In this way, when the spacing determination procedures are conducted for many times for adjusting the spacing in order to make the spacing meet the standard value, the capacitance can be measured without opening the reaction chamber and without breaking vacuum. This makes the entire process very convenient and the cost can be saved.

Therefore, form the above descriptions, it is known that by using the air variable capacitor with the restoration device, when the spacing between the heater and the showerhead decreases, the overlapping area of the two sets of conductive plates increase, and the air variable capacitor has a larger capacitance; and when the spacing increases, the overlapping area of the two sets of conductive plates decreases, and the air variable capacitor has a smaller capacitance.

Figure 1A:
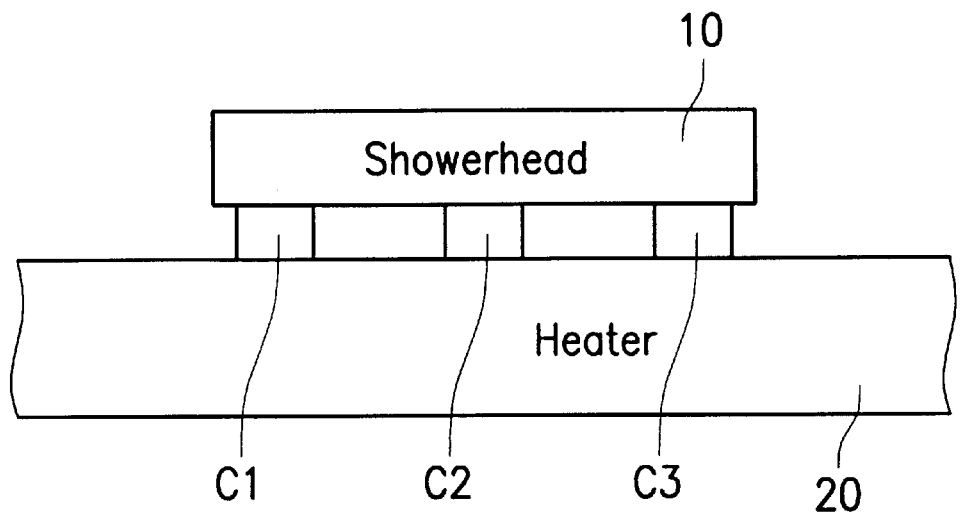
FIG. 1A is a schematic front view, illustrating the corresponding locations of the heater, showerhead, and variable capacitor.
Figure 1B:
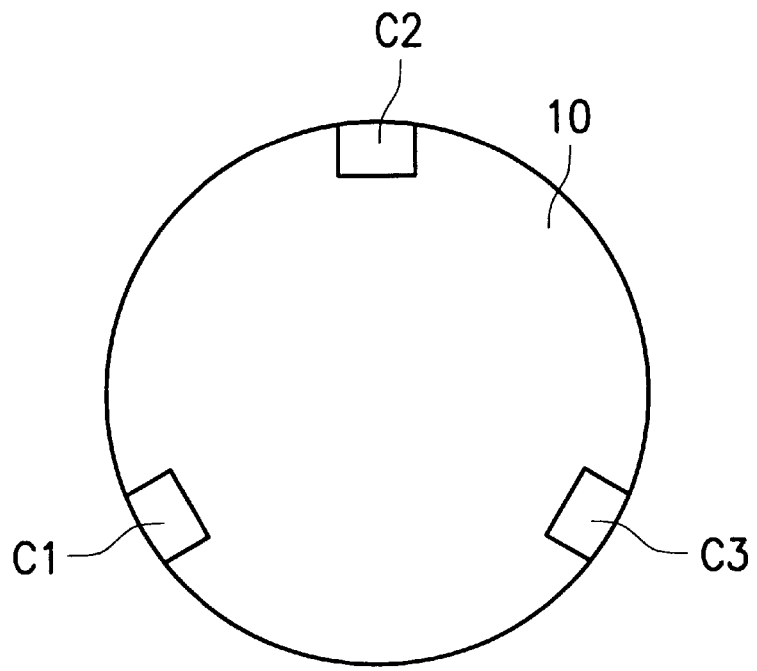
FIG. 1B is a schematic top view, illustrating the corresponding locations of the heater, showerhead, and variable capacitor.

According to a second preferred embodiment of the present invention, three variable capacitors are used to determine the spacing between a heater and a showerhead. Referring to FIGS. 1A and 1B, there are three variable capacitors C1, C2, and C3 provided between a showerhead 10 and a heater 20. FIG. 1A shows the schematic front view, and FIG. 1B shows the schematic top view. Thus, by measuring the capacitances of C1, C2, and C3, three spacing values can be obtained. Then, it can be known whether the showerhead is horizontal by comparing whether the three spacing values are the same.

The process of the present invention is particularly suitable for use in determining the spacing between the heater and showerhead both located in a chamber, for example, a chemical vapor deposition reaction chamber. Also, the process of the present invention can be conducted at a temperature of 300° C. to 800° C., particularly at a temperature of 350° C. to 450° C.

In conclusion, the present invention is characterized in that a variable capacitor is placed between a heater and a showerhead. Since the spacing between the heater and showerhead has a predetermined relationship to the capacitance of the variable capacitor, by means of measuring the capacitance, the spacing value between the heater and showerhead can be mathematically converted from the capacitance. The process of the present invention can be conducted at high temperature above 350° C. without opening the deposition chamber, which makes the entire process very convenient. The cost can also be saved accordingly.

The foregoing description of the preferred embodiments of the present invention has been provided for the purpose of illustration and description. It is not intended to be exhaustive or to limit the invention to the precise forms disclosed. Many modifications and variations will be apparent to practitioners skilled in the art. The embodiments were chosen and described to best explain the principles of the invention and its practical application, thereby enabling others skilled in the art to under stand the invention to practice various other embodiments and make various modifications suited to the particular use contemplated. It is intended that the scope of the invention be defined by the following claims and their equivalents.

What is claimed is:

1. A process for determining the spacing between a heater and a showerhead, comprising the steps of:
   (a) placing at least one air variable capacitor between the heater and the showerhead, such that the spacing between the heater and the showerhead is in a predetermined relationship to the capacitance of the air variable capacitor, and the relationship between the spacing and the capacitance is that when the spacing decreases, the variable capacitor has a higher capacitance, and when the spacing increases, the variable capacitor has a smaller capacitance;
   (b) measuring the capacitance of the air variable capacitor; and
   (c) converting the capacitance into the spacing between the heater and the showerhead,
      wherein the air variable capacitor is provided with an upper set of conductive plates, a lower set of conductive plates, and a restoration device provided at one end of the upper set of conductive plates to connect to the lower set of conductive plates, each set of conductive plates including a plurality of parallel and integrally formed conductive plates, the two sets of conductive plates being alternatively disposed and being overlapping, wherein when the upper set of conductive plates is pressed by a force, the overlapping area of the conductive plates is changed, and the capacitance of the air variable capacitor can be changed, and wherein when the upper set of conductive plates is released from the force, the upper set of conductive plates can be restored to its original state by the restoration device.

2. The process as claimed in claim 1, wherein when the spacing between the heater and the showerhead decreases, the overlapping area of the two sets of conductive plates increase, and the air variable capacitor has a larger capacitance; and when the spacing increases, the overlapping area of the two sets of conductive plates decreases, and the air variable capacitor has a smaller capacitance.

3. The process as claimed in claim 1, wherein the heater and the showerhead are located in a chamber.

4. The process as claimed in claim 3, wherein the chamber is a chemical vapor deposition chamber.

5. The process as claimed in claim 3, which is conducted at a temperature of 300° C. to 800° C.

6. The process as claimed in claim 3, which is conducted at a temperature of 350° C. to 450° C.

7. The process as claimed in claim 3, wherein the capacitance is measured outside the chamber.

8. The process as claimed in claim 3, wherein there is one or a plurality of showerheads on one heater.

9. The process as claimed in claim 3, wherein there are three variable capacitors provided between each showerhead and the heater.

* * * * *